(12) United States Patent
Xie

(10) Patent No.: US 11,563,410 B1
(45) Date of Patent: Jan. 24, 2023

(54) SYSTEMS AND METHODS FOR MULTI-BAND POWER AMPLIFIERS

(71) Applicant: Rockwell Collins, Inc., Cedar Rapids, IA (US)

(72) Inventor: Chenggang Xie, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 530 days.

(21) Appl. No.: 16/236,053

(22) Filed: Dec. 28, 2018

(51) Int. Cl.
| H03F 3/68 | (2006.01) |
| H03F 1/56 | (2006.01) |
| H03H 7/38 | (2006.01) |
| H04B 1/04 | (2006.01) |
| H03F 3/24 | (2006.01) |

(52) U.S. Cl.
CPC ............... *H03F 1/56* (2013.01); *H03F 3/24* (2013.01); *H03H 7/383* (2013.01); *H04B 1/0458* (2013.01); *H04B 1/0483* (2013.01); *H03F 2200/111* (2013.01)

(58) Field of Classification Search
CPC ........ H03F 1/56; H03F 3/24; H03F 2200/111; H03F 3/211; H03F 3/602; H03F 3/604; H03F 1/0288; H03F 3/68; H03F 2200/372; H04B 1/0458; H04B 1/0483; H03H 7/383
USPC ...................................... 330/124 R, 126, 295
See application file for complete search history.

(56) References Cited

U.S. PATENT DOCUMENTS

| 5,774,017 A * | 6/1998 | Adar .................. H03F 3/24 330/126 |
| 5,973,557 A * | 10/1999 | Miyaji ............... H03F 3/72 330/51 |
| 7,642,859 B2 * | 1/2010 | Shimada ............ H03F 3/68 330/126 |
| 7,656,228 B2 * | 2/2010 | Fukuda ............. H04B 1/0458 330/126 |
| 7,679,438 B2 * | 3/2010 | Tateoka ............ H03F 3/189 330/126 |
| 8,576,004 B2 * | 11/2013 | Dupuy ............. H03F 3/72 330/126 |
| 10,340,863 B2 * | 7/2019 | Okabe .............. H03F 3/68 |
| 2016/0241196 A1 * | 8/2016 | Lehtola ........... H03F 3/72 |

* cited by examiner

*Primary Examiner* — Khanh V Nguyen
(74) *Attorney, Agent, or Firm* — Suiter Swantz pc llo

(57) ABSTRACT

A power amplification circuit can include an input impedance matching circuit associated with one or more frequency bands of a plurality of frequency bands. The power amplification circuit can include a transistor with respective input coupled to an output of the input impedance matching circuit. The power amplification circuit can include a plurality of output impedance matching circuits. Each output impedance matching circuit can be associated with a respective frequency band of the plurality of frequency bands. The power amplification circuit can include a single pole multi-throw (SPMT) switch having an input terminal connected to an output of the transistor and a plurality of output terminals. Each output terminal of the SPMT switch can be connected to a corresponding output impedance matching circuit of the plurality of output impedance matching circuits.

13 Claims, 8 Drawing Sheets

SYSTEMS AND METHODS FOR MULTI-BAND POWER AMPLIFIERS

BACKGROUND

Radio frequency (RF) power amplifiers are commonly used in various systems and applications, such as telecommunication systems and devices, antenna and radar systems, media players and audio speakers, among others. RF power amplifiers amplify, or increase, the power of RF signals with minimal signal distortion. RF power amplifiers typically use direct current (DC) power to amplify RF signals.

In designing power amplifier circuits, many factors or parameters are considered, such as gain, bandwidth, power efficiency and input and output impedance matching, among others. The gain represents a measure of power increase in the output signal of a power amplifier compared to the corresponding input signal. The bandwidth represents the frequency band supported by the power amplifier, or the frequency band within which the power amplifier amplifies RF signals with minimal signal distortion. Power efficiency refers to power gain relative to the DC power used. Input and output impedance matching relates to designing the power amplifier circuit to have a predefined input impedance(s) to match the output impedance(s) of a corresponding RF signal source, and a predefined output impedance that matches the input impedance of a device or circuit coupled (or connected) to the output of the power amplifier.

Input and output impedance matching is meant to avoid signal reflection at the input and, respectively, the output of the power amplifier, and therefore, avoid or mitigate power loss. Specifically, mismatch between the input impedance of first circuit and the output impedance of a second circuit that is feeding the first circuit with RF signals leads to partial signal reflection at the connection between both circuits. To avoid or mitigate the signal reflection (or power loss) a power amplifier circuit can be designed to have predefined input and output impedances (e.g., 50 Ohms) that match output and, respectively, input impedances of other circuits or devices that can be connected to the power amplifier. Accordingly, accurate input and output impedance matching can help improve the gain and/or the power efficiency of the power amplifier circuit.

SUMMARY

In one aspect, the inventive concepts disclosed herein are directed to a power amplification circuit for use in a multi-band communication system. The power amplification circuit can include an input impedance matching circuit to receive input signals. Each input signal can be associated with a respective frequency band of a plurality of frequency bands supported by the power amplification circuit. The power amplification circuit can include a transistor having an input terminal electrically coupled to an output terminal of the input impedance matching circuit. The transistor can amplify signals received from the input impedance matching circuit. The power amplification circuit can include a plurality of output impedance matching circuit. Each output impedance matching circuit can be associated with a respective frequency band of the plurality of frequency bands. The power amplification circuit can include a switch having an input terminal and a plurality of output terminals. The input terminal of the switch can be connected to an output of the transistor. Each output terminal of the switch can be connected to a corresponding output impedance matching circuit of the plurality of output impedance matching circuits. The switch can couple the input terminal to one of the plurality of output terminals based on a frequency band associated with an input signal and the frequency bands of the plurality of output impedance matching circuits.

The input impedance matching circuit can include a first broadband impedance matching circuit with an output terminal electrically coupled to the input terminal of the transistor. The power amplification circuit can further include a second broadband impedance matching circuit arranged between the transistor and the switch.

The switch can include a single pole double throw (SPDT) switch. The SPDT switch can include at least one of a SPDT switch having series pin-diodes, a SPDT switch having shunt pin-diodes or a switching diode. The input impedance matching circuit can include a plurality of input impedance matching circuits.

The input impedance matching circuit can include a plurality of input impedance matching circuits. Each input impedance matching circuit can be associated with a respective frequency band of the plurality of frequency bands. The switch can be a first switch and the power amplification circuit can further include a second switch having a plurality of respective input terminals and a respective output terminal. Each of the plurality of respective input terminals of the second switch can be connected to a corresponding input impedance matching circuit of the plurality of input impedance matching circuits. The respective output terminal of the second switch can be connected to an input terminal of the transistor. The second switch can couple one of the plurality of respective input terminals to the respective output terminal based on a frequency band associated with an input signal and the frequency bands associated with the plurality of input impedance matching circuits. The second switch can include a single-pole-double-throw (SPDT) switch. The SPDT switch can include at least one of a SPDT switch having series pin-diodes, a SPDT switch having shunt pin-diodes or a switching diode.

The power amplification circuit can be embedded in an integrated circuit (IC). The IC can include a monolithic microwave integrated circuit (MMIC).

In a further aspect, the inventive concepts disclosed herein are directed to a communication device. The communication device can include a multi-band power amplification circuit and a controller. The multi-band power amplification circuit can include an input impedance matching circuit to receive input signals. Each input signal can be associated with a respective frequency band of a plurality of frequency bands supported by the multi-band power amplification circuit. The multi-band power amplification circuit can include a transistor having an input terminal electrically coupled to an output terminal of the input impedance matching circuit. The transistor can amplify signals received from the input impedance matching circuit. The multi-band power amplification circuit can include a plurality of output impedance matching circuits. Each output impedance matching circuit can be associated with a respective frequency band of the plurality of frequency bands. The multi-band power amplification circuit can include a switch having an input terminal and a plurality of output terminals. The input terminal of the switch can be connected to an output of the transistor and each output terminal of the switch can be connected to a corresponding output impedance matching circuit of the plurality of output impedance matching circuits. The controller can be connected to the multi-band power amplification circuit and can be configured to control the switch to couple the input terminal to one of the plurality of output terminals based on a frequency band associated with an input signal and the respective frequency bands of the plurality of output impedance matching circuits.

The input impedance matching circuit can include a first broadband impedance matching circuit with an output terminal electrically coupled to an input terminal of the transistor. The power amplification circuit can further include a second broadband impedance matching circuit arranged between the transistor and the switch.

The switch can include a single pole double throw (SPDT) switch. The SPDT switch can include at least one of a SPDT switch having series pin-diodes, a SPDT switch having shunt pin-diodes or a switching diode. The input impedance matching circuit can include a plurality of input impedance matching circuits.

The input impedance matching circuit can include a plurality of input impedance matching circuits. Each input impedance matching circuit can be associated with a respective frequency band of the plurality of frequency bands. The switch can be a first switch and the power amplification circuit can further include a second switch having a plurality of respective input terminals and a respective output terminal. Each of the plurality of respective input terminals of the second switch can be connected to a corresponding input impedance matching circuit of the plurality of input impedance matching circuits. The respective output terminal of the second switch can be connected to an input terminal of the transistor. The controller can be configured to control the second switch to couple one of the plurality of respective input terminals to the respective output terminal based on a frequency band associated with an input signal and the frequency bands associated with the plurality of input impedance matching circuits. The second switch can include at least one of a SPDT switch having series pin-diodes, a SPDT switch having shunt pin-diodes or a switching diode. The input impedance matching circuit can include a plurality of input impedance matching circuits.

The power amplification circuit can be embedded in an integrated circuit (IC). The IC can include a monolithic microwave integrated circuit (MMIC).

In a further aspect, the inventive concepts disclosed herein are directed to a method of providing a multi-band power amplification circuit. The method can include providing a plurality of input impedance matching circuits. Each input impedance matching circuit can be associated with a corresponding frequency band of a plurality of frequency bands, and can have a respective input impedance matching a predefined impedance value at least at one frequency within the corresponding frequency band associated with the input impedance matching circuit. The method can include providing a plurality of output impedance matching circuits. Each output impedance matching circuit can be associated with a corresponding frequency band of the plurality of frequency bands, and can have a respective output impedance matching the predefined impedance value at least at one frequency within the corresponding frequency band associated with the output impedance matching circuit. The method can include connecting each input impedance matching circuit of the plurality of input impedance matching circuits with a corresponding input terminal of a first single pole multi-throw (SPMT) having a plurality of input terminals and an output terminal. The method can include connecting the output terminal of the first SPMT switch to an input terminal of a transistor. The method can include connecting an output terminal of the transistor to an input terminal of a second single pole multi-throw (SPMT) switch having a respective input terminal and a plurality of respective output terminals. The method can include connecting each respective output terminal of the plurality of respective output terminals of the second SPMT switch to a corresponding output impedance matching circuit of the plurality of output impedance matching circuits.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

Figure 1:
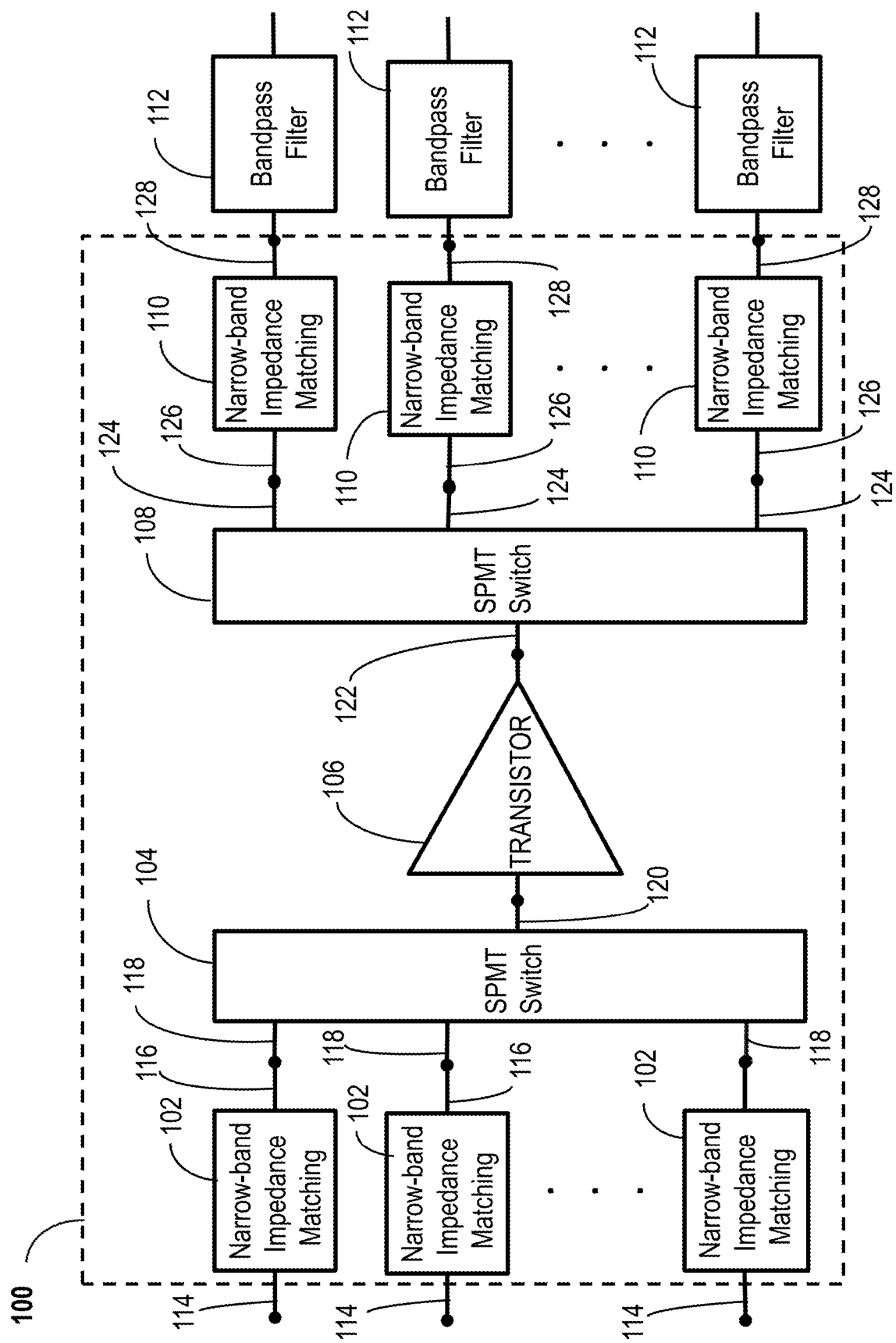
FIG. 1 shows a block diagram illustrating an example multi-band RF power amplifier, according to inventive concepts of this disclosure.

The details of various embodiments of the methods and systems are set forth in the accompanying drawings and the description below.

DETAILED DESCRIPTION

Before describing in detail embodiments of the inventive concepts disclosed herein, it should be observed that the inventive concepts disclosed herein include, but are not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

A multi-band communication system typically provides a plurality of frequency sub-bands (or frequency bands) over which to transmit or receive signals. Dividing a frequency spectrum (or a total bandwidth) of a communication system into a plurality of frequency sub-bands (or frequency bands) allows for efficient use of the frequency bandwidth as distinct frequency sub-bands (or frequency bands) can be use simultaneously by different separate devices or systems. However, a second (or higher) harmonic of a signal transmitted over one frequency sub-band (or band) can overlap with the fundamental frequency of another frequency sub-band (or band). For example, a multi-channel radio can be capable of providing radio frequency (RF) transmission over a first frequency band with a respective frequency range of 950 MHz to 1250 MHz and a second frequency band with a respective frequency range of 1350 MHz to 2200 MHz. The second harmonic of a signal in the first frequency band can have a carrier frequency within the frequency range of 1900 MHz to 2500 MHz, and therefore, can overlap with the second frequency band causing inter-band interference. To guarantee high performance communication, transmitters can be required or constrained to ensure that each second order harmonic is below 70 to 80 dB below the corresponding carrier signal.

One approach to guarantee relatively low level second (or higher) order harmonics, transmitters can employ second (or higher) order harmonic filters for each band frequency band. Another approach is to use a power amplifier (or high power amplifier) for each frequency band followed by a corresponding bandpass filter for that frequency band. However, using a separate power amplifier (or high power amplifier) for each frequency band increases the cost, size and weight of each transmitter (or receiver) circuit or unit as each power amplifier includes a separate transistor (or high power transistor). The transistor contributes significantly to the cost, size and weight of the corresponding power amplifier. As used herein, a high power amplifier refers to a RF power amplifier with relatively high RF output power, e.g., greater than 27 dBm (decibels relative to one milliwatt) or 0.5 Watt, or greater than 30 dBm or 1 Watt).

One approach to reduce the cost, size and weight of the transmitter (or receiver) unit or circuit is to use a single power amplifier with broadband impedance matching for the plurality of frequency bands supported by the multi-band communication system. However, the broadband impedance matching does not provide accurate (or optimal) impedance matching at the various frequency bands (or sub-bands), leading to partial signal reflection at the input and/or output of the power amplifier circuit. The partial signal reflection implies power loss and reduces efficiency and/or gain of the power amplifier circuit. Specifically, the input and/or output impedance of an impedance matching circuit varies with frequency. An impedance matching circuit for a given frequency band is usually designed based on the center frequency of (or other frequency within) the frequency band. In the case of broadband impedance matching, a broadband impedance matching circuit can be designed based on the center frequency (or other frequency) of the total frequency bandwidth. However, adequate impedance matching may not be achieved in the various frequency sub-bands (or frequency bands) of the total frequency bandwidth, therefore, resulting in reduced efficiency and/or gain of the power amplifier at one or more frequency sub-bands.

Multi-band power amplifier circuits described in this disclosure allow for reduced cost, size and weight multi-band communication units without compromising the power efficiency or gain of the power amplifier. Specifically, the multi-band power amplifier circuits described in this disclosure can employ a single transistor for signal amplification with plurality of input and/or output narrow-band impedance matching circuits. Each input or output narrow-band impedance matching circuit can be designed to achieve impedance matching within a corresponding frequency sub-band (or frequency band) of the plurality of frequency sub-bands (or frequency bands) supported by the multi-band communication system. As used herein, a narrow-band impedance matching circuit refers to an impedance matching circuit that is designed (or used) to achieve impedance matching within a corresponding frequency sub-band (or frequency band) of a plurality of frequency sub-bands (or frequency bands). A broadband impedance matching circuit refers to an impedance matching circuit that is designed (or used) to achieve impedance matching within a larger frequency band (or frequency spectrum) that includes a plurality of smaller frequency sub-bands supported by the multi-band communication system. The narrow-band input and/or output impedance matching circuits can be connected to the RF amplification transistor via a single pole multi-throw (SPMT) switch.

Referring now to the drawings, FIG. 1 shows a block diagram illustrating an example multi-band radio frequency (RF) power amplifier 100, according to inventive concepts of this disclosure. The multi-band RF power amplifier 100 can be a multi-band power amplifier (or multi-band high power amplifier). The multi-band RF power amplifier 100 can include a plurality of input narrow-band impedance matching circuits 102, each of which having a respective input terminal (or port) 114 and a respective output terminal (or port) 116. The multi-band RF power amplifier 100 can include a first single pole multi-throw (SPMT) switch 104 having a plurality of input terminals (or throws) 118 connected (e.g., electrically connected or coupled) to the output terminals 116 of the narrow-band impedance matching circuits 102, and a single output terminal (or pole) 120. The multi-band RF power amplifier 100 can also include a transistor 106 connected (e.g., electrically connected or coupled) to the output terminal 120 of the SPMT switch 104. The multi-band RF power amplifier 100 can also include a second single pole multi-throw (SPMT) switch 108 having a single input terminal (or pole) 122 connected (e.g., electrically connected or coupled) to the output of the transistor 106, and a plurality of output terminals (or throws) 124. The multi-band RF power amplifier 100 can also include a plurality of output narrow-band impedance matching circuits 110, each of which can have an input terminal (or port) 126 connected (e.g., electrically connected) to a respective output terminal (or respective throw) 124 of the second SPMT switch 108, and an output terminal 128 connected (e.g., electrically coupled or connected) to a respective bandpass filter 112. The bandpass filters 112 can be part of, or connected (e.g., electrically coupled or connected) to, the multi-band RF power amplifier 100.

Each of the input narrow-band impedance matching circuits 102 can be associated with a respective frequency sub-band (or a respective frequency band). Separate input narrow-band impedance matching circuits 102 can be associated with distinct frequency sub-bands (or frequency bands). For instance, the frequency spectrum supported by the multi-band RF power amplifier 100 (or supported by a communications system integrating the multi-band RF power amplifier 100) can be divided into a plurality of frequency sub-bands. Each frequency sub-band can be associated with a respective communication channel. Each input narrow-band impedance matching circuit 102 can receive input signals associated with the respective frequency sub-band to be amplified by the multi-band RF amplifier 100. Each input narrow-band impedance matching circuit 102 can be connected to a signal source (not shown in FIG. 1), such as a receiver circuit, an antenna or a signal generator, among others. The input narrow-band impedance matching circuits 102 can be connected to the signal source, for example, via a switch, a de-multiplexer circuit or respective bandpass filters, among others (none of which is shown in FIG. 1). The switch, de-multiplexer circuit or bandpass filters can be viewed as being part of the signal source. The signal source can have multiple output ports (or terminals), each of which can be connected to an input terminal (or port) 114 of a respective input narrow-band impedance matching circuit 102. The input terminals (or ports) 114 of the input narrow-band impedance matching circuits 102 can be viewed as input ports of the multi-band RF power amplifier 100.

Each input narrow-band impedance matching circuit 102 can be designed to have an input impedance (e.g., when integrated in the multi-band RF amplifier 100) that matches or approximates, within the corresponding frequency sub-band, the output impedance of the at the corresponding output port of the signal source. For example, each input narrow-band impedance matching circuit 102 can be designed to have a respective input impedance at the respective input terminal 114 (e.g., when integrated in the multi-band RF power amplifier 100) that is equal to, or approximates, the output impedance at the output terminal (or port) of the signal source that is connected (or coupled) to the input terminal 114. In particular, the electric components of each input narrow-band impedance matching circuit 102 can be selected, and the interconnections between such components can be designed, to achieve (within the corresponding frequency sub-band) the desired output impedance for that input narrow-band impedance matching circuit 102 without distorting received signals. For each input narrow-band impedance matching circuit 110, the corresponding desired input impedance can be defined based on an output impedance of the signal source. For each input narrow-band impedance matching circuit 102, the corresponding desired input impedance can be equal to 50 Ohms.

Mismatch between the output impedance of the signal source and the input impedance of the multi-band RF power amplifier 100 leads to partial signal reflection at the input terminals 114 of the multi-band RF power amplifier 100. The larger is the impedance mismatch, the greater is the reflected signal portion. Signal reflections due to impedance mismatch lead to power inefficiencies as only a fraction of an input signal gets amplified by the multi-band RF power amplifier 100. Accordingly, using or integrating the input narrow-band impedance matching circuits 102 in the multi-band RF power amplifier 100 allows for improved amplification and enhanced power efficiency.

The input impedance of a given circuit, such as the input impedance matching circuits 102, can vary with the frequency at which the circuit is operating at any given time. For example, in a circuit that includes capacitance and/or inductance components, the respective input current and/or input voltage can be frequency dependent leading to the respective input impedance being frequency dependent. Similarly, the respective output current and/or output voltage can be frequency dependent leading to the respective output impedance being frequency dependent. Considering the frequency dependencies of input and output impedances, input and or output impedance matching circuits can be designed based on the center frequency of the corresponding frequency band. However, the larger is the frequency band, the less accurate the impedance matching or approximation gets at frequencies away from the center frequency and closer to the boundaries of the frequency band. Especially in a multi-band communication system, designing impedance matching circuits based on the center frequency of the cumulative frequency spectrum (or the total frequency band) of the multi-band communication system leads to poor (or less optimal) impedance matching at the various frequency sub-bands.

In the multi-band RF power amplifier 100, a separate input narrow-band impedance matching circuit 102 can be used for each frequency sub-band allowing for improved impedance matching or approximation. Each output signal of the signal source that is associated with a given frequency sub-band can be received at the input narrow-band impedance matching circuit 102 associated with that frequency sub-band to be amplified by the multi-band RF power amplifier 100. The input narrow-band impedance matching circuit 102 allows for little or no signal reflection at the corresponding input terminal 114. From a different perspective, the input narrow-band impedance matching circuits 102 can be viewed as being integrated at the output ports of the signal source, and each input narrow-band impedance matching circuit 102 can be designed to have respective output impedance (at the respective output terminal 116) that matches or approximates the input impedance at the corresponding input terminal (or corresponding throw) 118 of the first SPMT switch 104.

The first SPMT switch 104 can include a plurality of input terminals (or throws) 118 and a single output terminal (or pole) 120. For the first SPMT switch 104, the respective throws act as input terminals whereas the single pole acts an output terminal. The first SPMT switch 104 can be capable of switching between the respective input terminals (or throws). For instance, the first SPMT switch 104 can be controlled, or driven, by a respective controller (not shown in FIG. 1). The controller can include a control circuit, a hardware processor or a combination thereof. The control circuit (or processor) can cause the first SPMT switch 104 to switch between the respective input terminals (or throws) 114 based on the frequency sub-band of an input signal and the frequency sub-bands of the input narrow-band impedance matching circuits 102. For example, the controller can be connected (e.g., electrically or communicatively connected) to the multi-band RF power amplifier 100. The controller may also be connected to the signal source. Given the frequency sub-band associated with an input signal, the controller can cause the first SPMT switch 104 to couple the throw connected with the input narrow-band impedance matching circuit 102 that is associated with the same frequency sub-band as the input signal to the single pole (e.g., by forming a conducting path between the pole and the throw). The controller can cause the first SPMT switch 104 to switch periodically, for example, according to a predefined sequential order or based on indications of the input signal sub-band received by the controller. The output terminal 120 of the first SPMT switch 104 can be connected to the input of the transistor 106. The first SPMT switch 104 can include a single pole double throw switch, a pin-diode switch or a switching transistor, among others.

The transistor 106 can receive the signal from the first SPMT switch 104, and amplify the signal. The output of the transistor 106 can be connected (e.g., electrically connected) to the input terminal 122 of the second SPMT switch 108. The transistor 106 can output the amplified signal to the second SPMT switch 108. The transistor 106 can include, for example, a metal-oxide-semiconductor field-effect transistor (MOSFET), a Gallium Nitride (GaN) high electron mobility transistor (HEMT), a Gallium arsenide (GaAs) HEMT, a RF complementary metal-oxide semiconductor (CMOS) transistor, a silicon-germanium (SiGe) bipolar junction complementary metal-oxide semiconductor (BiCMOS) transistor or a SiGe complementary lateral-drain-extended metal-oxide semiconductor (CLDMOS) transistor, among others. The second SPMT switch 108 can be capable of switching between the respective output terminals (or throws) 124 (e.g., creating a conducting path between the single pole and one of the plurality of throws) to route the amplified signal from the input terminal (or pole) 122 to one of the output terminals (or throws) 124. For the second SPMT switch 108, the respective pole can act as an input terminal and the respective throws can act as output terminals.

The second SPMT switch 108 can be driven, or controlled, by a respective controller. The controller can include a control circuit, a hardware processor or a combination thereof. The first and second SPMT switches 104 and 108 can be controlled by the same controller or by separate controllers. The controller can cause the second SPMT switch 108 to switch between the respective output terminals 124 according to a predefined sequential order or based on the frequency of the input signal received from the signal source and the frequency sub-bands associated with the output narrow-band impedance matching circuits 110. For example, the controller can be connected (e.g., electrically or communicatively connected) to the multi-band RF power amplifier 100. The controller may also be connected to the signal source. Given the frequency sub-band associated with an input signal, the controller can cause the second SPMT switch 108 to couple the single pole to the throw (or create a conducting path between the single pole and the throw) that is connected to the narrow-band output impedance matching circuit 110 associated with the same frequency sub-band as the input signal. The controller can cause the second SPMT switch 108 to switch periodically, for example, according to a predefined sequential order or based on indications of the input signal sub-band received by the controller. The second SPMT switch 108 can include a single pole double throw (SPDT) switch, a pin-diode switch or a switching transistor, among others. The first and second SPMT switches 104 and 108 can be similar to each except, for example, for the direction of RF signal flow or the roles of the pole and the throws (e.g., input our output terminals).

Each output terminal (or throw) 124 of the second SPMT switch 108 can be coupled (e.g., electrically connected) to the input terminal 126 of a respective output narrow-band impedance matching circuit 110. Each output narrow-band impedance matching circuit 110 can be associated with a respective frequency sub-band. The plurality of frequency sub-bands associated with the output narrow-band impedance matching circuits 110 can be similar to the plurality of frequency sub-bands associated with the input narrow-band impedance matching circuits 104. Each output narrow-band impedance matching circuit 110 can be designed to have a respective output impedance (e.g., when integrated within the multi-band RF power amplifier 100) at the respective output terminal 124 that matches or approximates, within the corresponding frequency sub-band, the input impedance of the bandpass filter 112 connected to the output narrow-band impedance matching circuit 110. In particular, the electric components of each output narrow-band impedance matching circuit 110 can be selected, and the interconnections between such components can be designed, to achieve (within the corresponding frequency sub-band) the desired output impedance for that output narrow-band impedance matching circuit 110 without distorting the signal output by the transistor 106 through the SPMT switch 108. For each output narrow-band impedance matching circuit 110, the corresponding desired output impedance can be defined based on the input impedance of the corresponding bandpass filter 112. For each output narrow-band impedance matching circuit 110, the corresponding desired output impedance can be equal to 50 Ohms.

The output terminal (or port) 128 of each output narrow-band impedance matching circuit 110 can be connected to a corresponding bandpass filter 112. The bandpass filters 112 can be part of a device or circuit (e.g., an antenna, a transmitter circuit, a loud speaker, a processor, or a digital signal processor (DSP), among others) connected to the output of the multi-band RF power amplifier 100. The output terminals 128 can be viewed as the output terminals of the multi-band RF power amplifier 100. The use of the output impedance matching circuits 110 allows for matching the output impedance(s) of the multi-band RF power amplifier 100 to the input impedance(s) of the bandpass filters 112 or the device or circuit connected to the output of the multi-band RF power amplifier 100, and therefore, prevents or mitigates signal reflections at the output terminals 128.

The use of a plurality of output narrow-band impedance matching circuits 110 at the output of the multi-band RF power amplifier 100, e.g., instead of using a single broadband RF power amplifier 100, allows for improved impedance matching at the output of the multi-band RF power amplifier 100. Specifically, as discussed above with regard to the input narrow-band impedance matching circuits 102, the output impedance of impedance matching circuits can be frequency dependent. In designing output impedance matching circuit, the respective output impedance at a given frequency (e.g., the center frequency of the corresponding operational frequency band) is usually considered. As such, using a plurality of output narrow-band impedance matching circuits, each of which being associated with a corresponding frequency sub-band, leads to improved impedance matching compared to, for example, using a single output broadband impedance matching circuit.

Each of the bandpass filters 112 can have a pass band equal to the frequency sub-band associated with the corresponding output narrow-band impedance matching circuit 110. The pass band of each bandpass filter 112 can be slightly greater than (e.g., equal to 1.01, 1.02 or 1.05, among others, times) the frequency sub-band associated with the corresponding output narrow-band impedance matching circuit 110. The pass band of each bandpass filter 112 can be slightly smaller than (e.g., equal to 0.99, 0.98 or 0.95, among others, times) the frequency sub-band associated with the corresponding output narrow-band impedance matching circuit 110.

Figure 2:
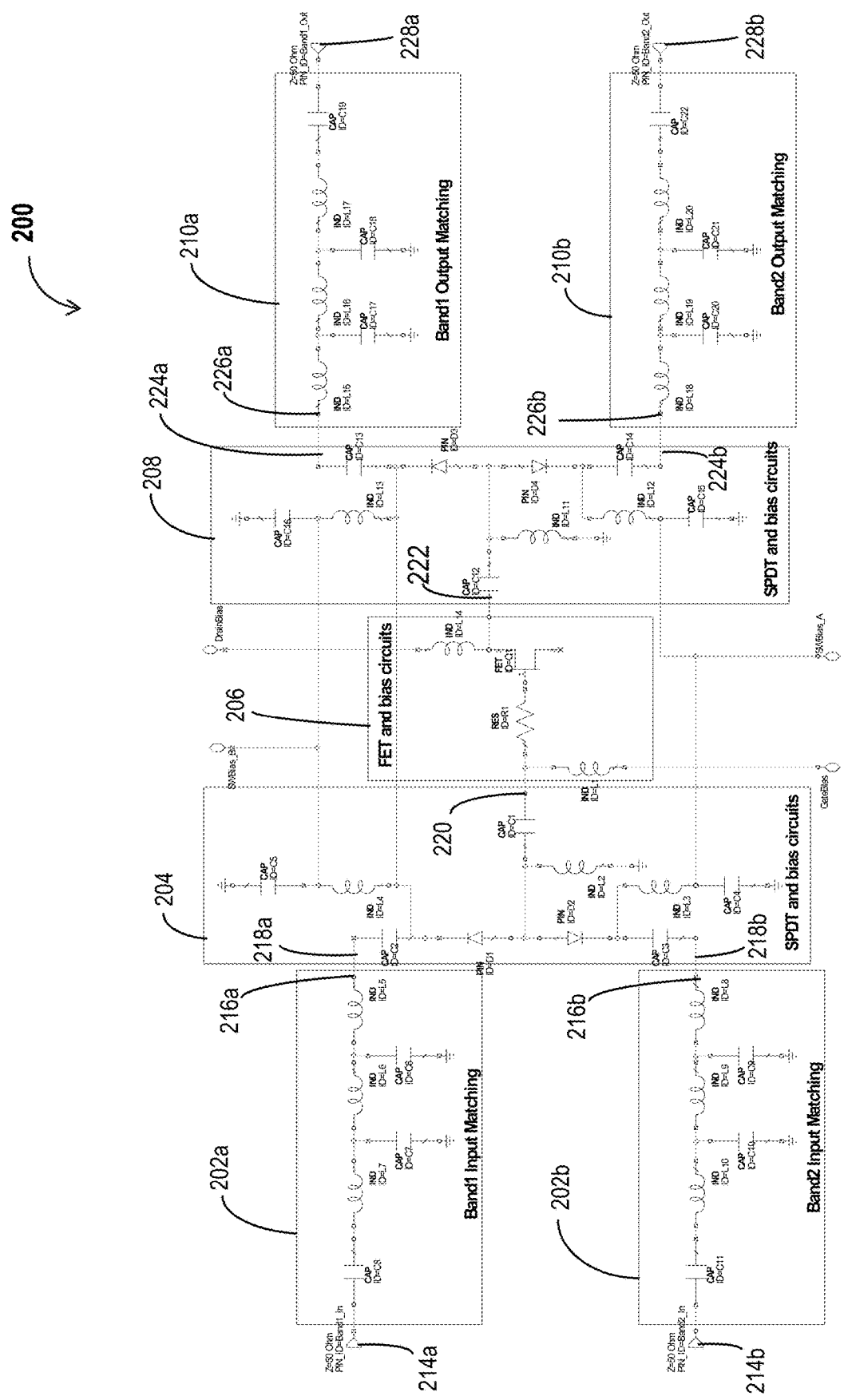
FIG. 2 shows an example dual-band RF power amplifier circuit, according to inventive concepts of this disclosure.

Referring to FIG. 2, an example dual-band RF power amplifier circuit 200 is shown, according to inventive concepts of this disclosure. The dual-band RF power amplifier circuit 200 can be viewed as an example circuit implementation of the multi-band RF power amplifier 100 of FIG. 1. The dual band RF power amplifier circuit 200 can include a pair of input impedance matching circuits 202a and 202b. Each of the pair of input impedance matching circuits 202a and 202b can be associated with a respective frequency band of a pair of frequency bands supported by the dual band RF power amplifier circuit 200. The dual band RF power amplifier circuit 200 can also include a first SPDT switch 204 and a transistor circuit 206 connected (e.g., electrically connected or coupled) to the output of the first SPDT switch 204. The dual band RF power amplifier circuit 200 can also include a second SPDT switch 208 electrically connected or coupled to the output of the transistor circuit 206. The dual band RF power amplifier circuit 200 can also include a pair of output impedance matching circuits 210 electrically connected or coupled to the second SPDT switch 208. Each of the pair of output impedance matching circuits 210a and 210b can be associated with a respective frequency band of the pair of frequency bands supported by the dual band RF power amplifier circuit 200.

The input impedance matching circuit 202a can have an input terminal (or port) 214a and an output terminal (or port) 216a. The input impedance matching circuit 202b can have an input terminal (or port) 214b and an output terminal (or port) 216b. The input terminals 214a and 214b can be connected, respectively, to a first and second output terminals of a signal source (not shown in FIG. 2). The input impedance matching circuits 202a and 202b can be associated with a first frequency band and a second frequency band, respectively, that are supported by the dual band RF power amplifier circuit 200. For example, the first frequency band can be equal to the frequency range 950-1250 MHz, and the second frequency band can be equal to the frequency range 1350-2200 MHz. These frequency ranges for the first and second frequency bands are provided for illustrative purposes and are not to be interpreted as limiting. Other frequency ranges for the first and second frequency bands are also contemplated by the current disclosure.

The input impedance matching circuits 202a and 202b can have similar designs (or configurations) but with different electrical components' values. The capacitances of capacitors C6, C7 and C8 and the inductances of the inductors L5, L6 and L7 in the input impedance matching circuit 202a can be selected so that the input impedance at the input terminal 214a (e.g., at the center frequency of the first frequency band associated with the input impedance matching circuit 202a) is equal to, or approximates, the output impedance at the first output terminal (or port) of the signal source. For example, the capacitances of capacitors C6, C7 and C8 and the inductances of the inductors L5, L6 and L7 can be selected so that the input impedance at the input terminal 214a (e.g., at the center frequency of the first frequency band associated with the input impedance matching circuit 202a) is equal to 50 Ohms. Similarly, the capacitances of capacitors C9, C10 and C11 and the inductances of the inductors L8, L9 and L10 in the input impedance matching circuit 202b can be selected so that the input impedance at the input terminal 214b (e.g., at the center frequency of the second frequency band associated with the input impedance matching circuit 202b) is equal to, or approximates, the output impedance at the second output terminal (or port) of the signal source. For example, the capacitances of capacitors C9, C10 and C11 and the inductances of the inductors L8, L9 and L10 can be selected so that the input impedance at the input terminal 214b (e.g., at the center frequency of the second frequency band associated with the input impedance matching circuit 202b) is equal to 50 Ohms.

The first SPDT switch 204 can have a pair of input terminals (or throws) 218a and 218b electrically connected or coupled, respectively, to the output terminals 216a and 216b of the input impedance matching circuits 202a and 202b. The first SPDT switch 204 can also have a single output terminal (or pole) 220 that can be electrically connected or coupled to the input of the transistor circuit 206. The first SPDT switch 204 can switch between the respective input terminals (or throws) 218a and 218b. For example, at any time instant, (e.g., based on bias voltage values of SW Bias_A and SW Bias_B) only one of the diodes D1 or D2 can pass electric current while the other can act as pair of disconnected terminals. For the first SPDT switch 204, the pole 220 can as an output terminal while the pair of throws 218a and 218b can act as input terminals. That is, RF signals can flow from one of the throws 218a or 218b to the pole 220.

The transistor circuit 206 can include a transistor and a corresponding bias circuit. The transistor in the transistor circuit 206 can include, for example, a metal—oxide—semiconductor field-effect transistor (MOSFET), a Gallium Nitride (GaN) high electron mobility transistor (HEMT), a Gallium arsenide (GaAs) HEMT, a RF complementary metal-oxide semiconductor (CMOS) transistor, a silicon-germanium (SiGe) bipolar junction complementary metal-oxide semiconductor (BiCMOS) transistor or a SiGe complementary lateral-drain-extended metal-oxide semiconductor (CLDMOS) transistor, among others.

The second SPDT switch 208 can have a single input terminal (or pole) 222 that can be electrically connected or coupled to the output of the transistor circuit 206. The second SPDT switch 208 can also have a pair of output terminals (or throws) 224a and 224b. The second SPDT switch 208 can switch between the respective output terminals (or throws) 224a and 224b. For example, depending on the bias voltage values of SW Bias_A and SW Bias_B, only one of the diodes D3 and D4 can pass electric current at any time instant while the other acts as a pair of disconnected terminals. For the second SPDT switch 208, the pole 222 can as an input terminal while the pair of throws 224a and 224b can act as output terminals. That is, RF signals can flow from the pole 222 to one of the throws 224a or 224b.

The output impedance matching circuit 210a can have an input terminal (or port) 226a and an output terminal (or port) 228a. The output impedance matching circuit 210b can have an input terminal (or port) 226b and an output terminal (or port) 228b. The input terminals 226a and 226b can be connected, respectively, to the output terminals (or throws) 224a and 224b of the second SPDT switch 208. The output impedance matching circuits 210a and 210b can be associated with the first frequency band and the second frequency band, respectively, that are supported by the dual band RF power amplifier circuit 200. The output terminals 228a and 228b can be viewed as output terminals of the dual band RF power amplifier circuit 200. The output terminals 228a and 228b can be connected to corresponding bandpass filters or corresponding output ports of an output circuit or device (not shown in FIG. 2) to receive signals amplified by the dual band RF power amplifier circuit 200.

The output impedance matching circuits 210a and 210b can have similar designs (or architectures) but with different electrical components' values. For instance, the output impedance matching circuits 210a and 210b can have reversed designs (or reversed architectures) compared to the input impedance matching circuits 202a and 202b. The capacitances of capacitors C17, C18 and C19 and the inductances of the inductors L15, L16 and L17 in the output impedance matching circuit 210a can be selected so that the output impedance at the output terminal 228a (e.g., at the center frequency of the first frequency band associated with the output impedance matching circuit 210a) is equal to, or approximates, the input impedance of a corresponding bandpass filter or at a corresponding input terminal (or port) of the output circuit or device (not shown in FIG. 2). For example, the capacitances of capacitors C17, C18 and C19 and the inductances of the inductors L15, L16 and L17 can be selected so that the output impedance at the output terminal 228a (e.g., at the center frequency of the first frequency band associated with the input impedance matching circuit 210a) is equal to 50 Ohms. Similarly, the capacitances of capacitors C20, C21 and C22 and the inductances of the inductors L18, L19 and L20 in the output impedance matching circuit 210b can be selected so that the output impedance at the output terminal 228b (e.g., at the center frequency of the second frequency band associated with the output impedance matching circuit 210b) is equal to, or approximates, the input impedance of a corresponding bandpass filter or at a corresponding input terminal (or port) of the output circuit or device. For example, the capacitances of capacitors C20, C21 and C22 and the inductances of the inductors L18, L19 and L20 can be selected so that the output impedance at the output terminal 228b (e.g., at the center frequency of the second frequency band associated with the output impedance matching circuit 210b) is equal to 50 Ohms.

Figure 3:
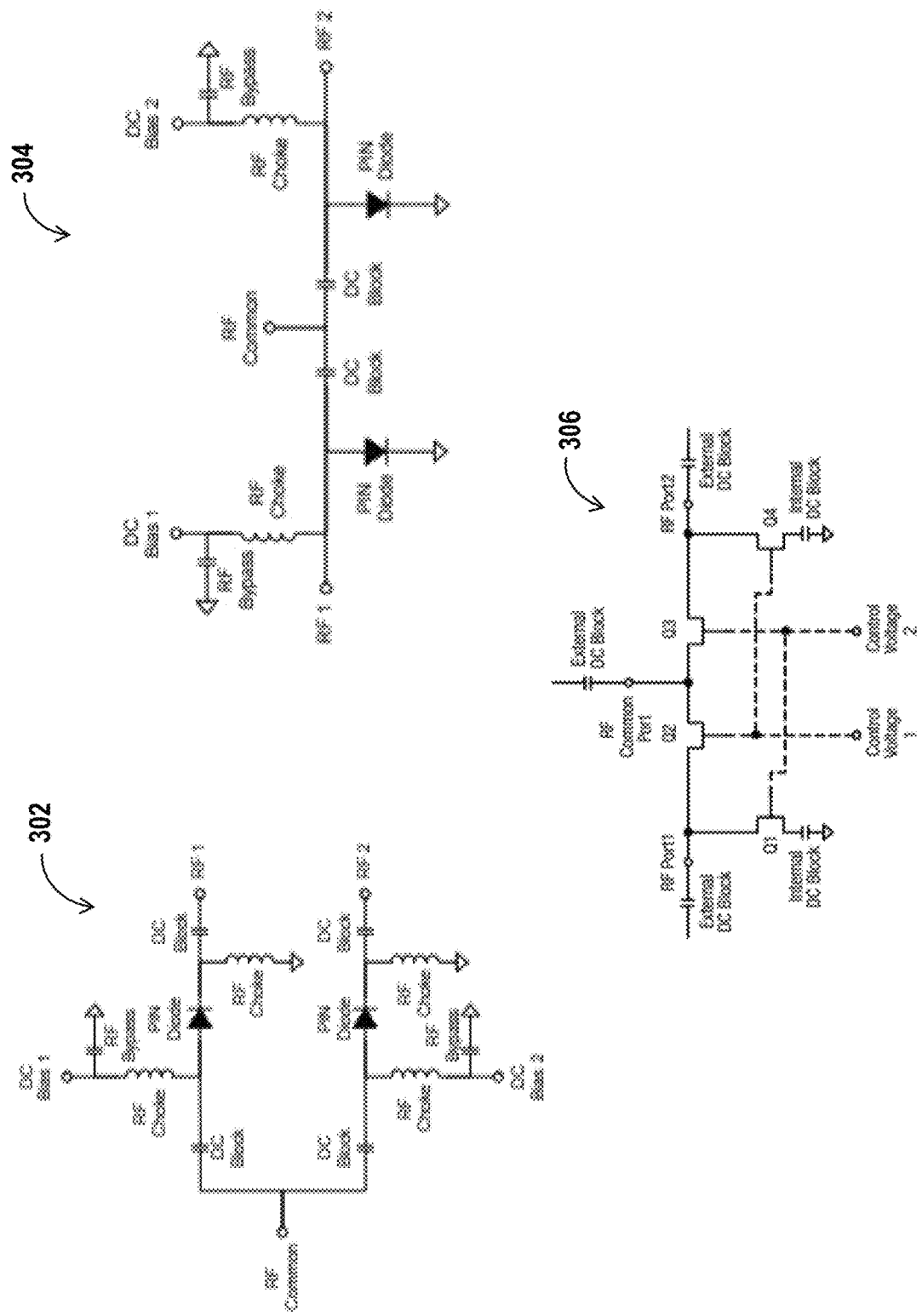
FIG. 3 shows various example single pole double throw (SPDT) switch circuits, according to inventive concepts of the current disclosure.

Referring to FIG. 3, various example SPDT switch circuits are shown, according to inventive concepts of the current disclosure. Each of the SPDT switch circuits 302, 304 or 306 can be used, for example, as the first SPDT switch 204 or second SPDT switch 208 in the dual band RF power amplifier 200 of FIG. 2. SPDT switch circuit 302 can represent an example SPDT switch with series pin diodes. The "RF Common" terminal, which is the pole of the SPDT switch, can act as an input terminal and the terminals "RF 1" and "RF 2" (throws) can act as output terminals. The "RF Common" terminal can act as an output terminal while the terminals "RF 1" and "RF 2" can act as input terminals. Depending on the voltage bias values "DC Bias 1" and "DC Bias 2," only one of the series pin diodes can pass electric current at a given point of time while the other can disconnect the corresponding branch or arm (or corresponding terminal; either "RF1" or "RF 2") from the "RF Common" terminal.

SPST switch circuit 304 can represent an example SPDT switch with shunt pin diodes. Similar to SPDT switch circuit 302, the "RF Common" terminal (or pole) can act as an input terminal while the terminals "RF 1" and "RF 2" (or throws) can act as output terminals. The "RF Common" terminal can act as an output terminal while the terminals "RF 1" and "RF 2" can act as input terminals. Depending on the voltage bias values "DC Bias 1" and "DC Bias 2," only one of the shunt pin diodes can pass electric current at a given point of time, therefore, connecting the corresponding "DC Block" to the electric ground and disconnecting the corresponding branch or arm (or corresponding terminal; either "RF1" or "RF 2") from the "RF Common" terminal. At the same time, the other shunt pin diode can act as an open circuit resulting in current flow between the corresponding RF terminal (either "RF1" or "RF 2") and the "RF Common" terminal.

SPDT switch circuit 306 can represent an example switching transistor (e.g., field effect transistor (FET) transistor or GaN transistor, among others) that can act as a SPDT switch. Similar to SPDT switch circuits 302 and 304, the switch circuit 306 can have an "RF Common Port" (or pole) and a pair of other RF ports (or throws), "RF Port 1" and "RF Port 2", between which the SPDT switch circuit 306 can switch. Depending on the DC voltages "Control Voltage 1" and "Control Voltage 2" applied to the gate port controls, a conduction path or channel can be formed between the "RF Common Port" and either "RF Port 1" or "RF Port 2," while the conduction path or channel between the "RF common Port" and the other RF port ("RF Port 2" or "RF Port 1") can be open. The "RF Common Port" can be used as an input port while the ports "RF Port 1" and "RF Port 2" can be used as output ports. The "RF Common Port" can be used as an output port while the ports "RF Port 1" and "RF Port 2" can be used as input ports.

The circuits 204, 208, 302, 304 and 306 represent illustrative examples of SPDT switches the can be used, among others, in dual band RF power amplifiers described in, or contemplated by, the current disclosure. Also, these circuits can be used as building blocks to construct SPMT switches, for use in a multi-band power amplifier circuit, as illustrated, for example, in FIG. 4.

Figure 4:
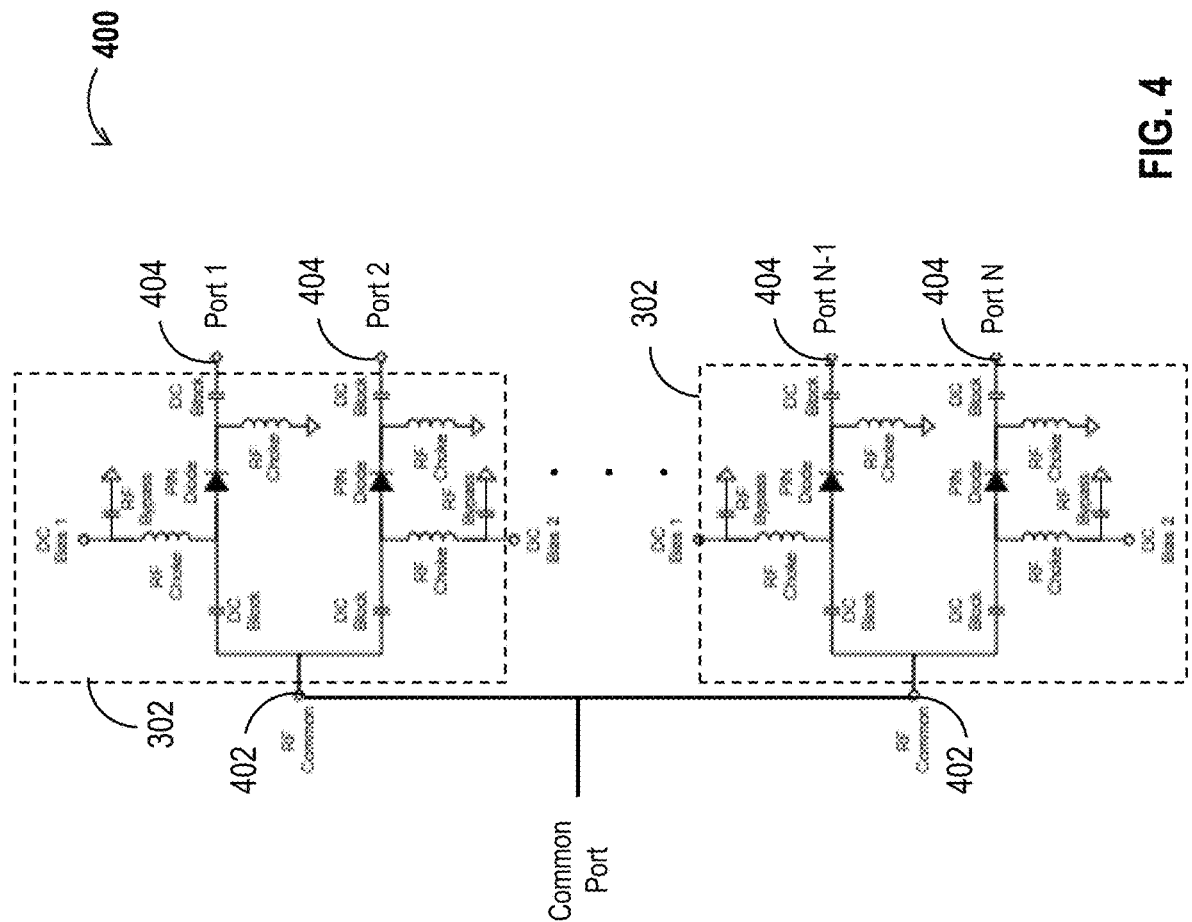
FIG. 4 shows an example circuit of a single pole multi-throw (SPMT) switch, according to inventive concepts of the current disclosure.

Referring to FIG. 4, an example circuit of a SPMT switch 400 is shown, according to inventive concepts of the current disclosure. The SPMT switch 400 can include a plurality of SPDT switch circuits 302 (SPDT switches with series pin diodes). The common ports 402 of the SPDT switch circuits 302 are connected to each other to form a common port (or pole) of the SPMT switch 400. The plurality of pairs of other RF ports 404 of the SPDT switch circuits 302 can form N separate RF ports (or throws) 404 of the SPMT switch 400, where N is an integer greater than 2. While the SPMT switch 400 shown in FIG. 4 may imply that N is an even number, the multi-port switch 400 can have an odd number of RF ports 404, for example, by leaving one of the ports 404 disconnected.

In the SPMT switch 400, the common RF port (or pole) 402 acts as an input port while the RF ports (throws) 404 can act as output ports. The common RF port (or pole) 402 can act as an output port while the RF ports (or throws) 404 can act as input ports. The bias voltages "DC Bias 1" and "DC Bias 2" of each of the SPDT switch circuits 302 can be controlled by a controller, for example, another circuit or processor (not shown in FIG. 4). The controller can cause only one of the RF ports (or throws) 404 to be connected through a conduction path to the common RF port (or pole) 402, at any given time instant while the pin diodes associated with other RF ports 404 are caused to be open and not pass electric current. In some implementations, the SPMT switch 400 can include a plurality of SPDT switch circuits 304 or a plurality of SPDT switch circuits 306, among others switch circuits (e.g., instead of the plurality of switch circuits 302). The SPMT switch 400 can include a combination of the switch circuits 302, 304 and/or 306, among other switch circuits.

Figure 5:
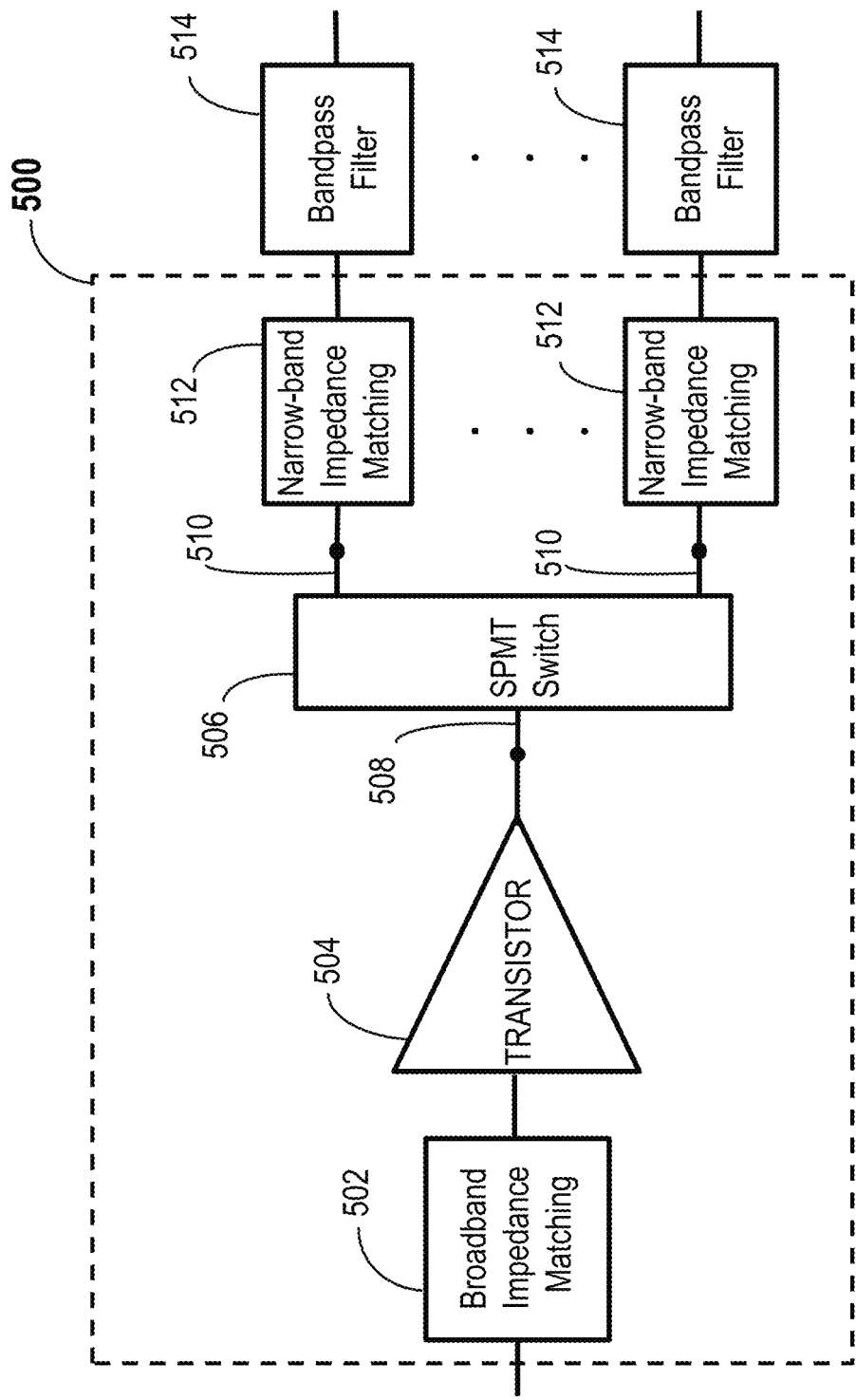
FIG. 5 shows a block diagram illustrating another example multi-band RF power amplifier, according to inventive concepts of the current disclosure.

Referring now to FIG. 5, a block diagram illustrating another example multi-band RF power amplifier 500, according to inventive concepts of this disclosure. The multi-band RF power amplifier 500 can include an input broadband impedance matching circuit 502 and a transistor 504. The output of the input broadband impedance matching circuit 502 can be connected (e.g., electrically connected or coupled) to the input of the transistor 504. The multi-band RF power amplifier 500 can include a SPMT switch 506 having a single input terminal 508 and a plurality of output terminal 510. The input terminal 508 of the SPMT switch 506 can be connected (e.g., electrically connected or coupled) to the output of the transistor 504. The multi-band RF power amplifier 500 can include a plurality of output narrow-band impedance matching circuits 512, the input of each of which can be connected (e.g., electrically connected or coupled) to a corresponding output terminal 510 of the SPMT switch 506. The output of each output narrow-band impedance matching circuit 512 can be connected (e.g., electrically connected or coupled) to the output of a corresponding bandpass filter 514 of a plurality of bandpass filters 516.

Compared to the multi-band RF power amplifier 100 of FIG. 1, the input broadband impedance matching circuit 502 in the multi-band RF power amplifier 500 can be viewed as replacing the plurality of input narrow-band impedance matching circuits 102 and the first SPMT switch 104 of the multi-band RF power amplifier 100 of FIG. 1. The input broadband impedance matching circuit 502 can be associated with a respective frequency band, and can receive signals associated with that frequency band to be amplified by the multi-band RF power amplifier 100. The frequency band associated with the input broadband impedance matching circuit 502 can be equal to the full frequency spectrum (or the full frequency band) supported by the multi-band RF power amplifier 500 or by a multi-band communication system integrating the multi-band RF power amplifier 500. For instance, the frequency band associated with the input broadband impedance matching circuit 502 can include a plurality of frequency sub-bands, each of which can be associated with a corresponding output narrow-band impedance matching circuit 512.

The input broadband impedance matching circuit 502 can be designed to have an input impedance that matches or approximates, e.g., at the center frequency of the corresponding frequency band, the output impedance of a signal source device or system (not shown in FIG. 1) that is connected to the input of the input broadband impedance matching circuit 502. For example, the input broadband impedance matching circuit 502 can be designed to have an input impedance equal to 50 Ohms at the center frequency of the corresponding frequency band. The input of the input broadband impedance matching circuit 502 can be viewed as the input of the multi-band RF power amplifier 500. Similar to the output narrow-band impedance matching circuits 110 or 210a and 210b, each of the output narrow-band impedance matching circuits 512 can be associated with a respective frequency sub-band of a plurality of frequency sub-bands supported by the multi-band RF power amplifier 500 or by a multi-band communication system integrating the multi-band RF power amplifier 500. Each of the output narrow-band impedance matching circuits 512 can be designed to have a respective output impedance that matches or approximates (e.g., at the center frequency of the corresponding frequency sub-band) the input impedance of the corresponding bandpass filter 514.

The SPMT switch 506 can be similar to the first and/or second SPMT switches 104 and 108 of FIG. 1. The multi-band RF power amplifier 500 may include a second broadband impedance matching circuit 506 that can be arranged between the transistor 504 and the SPMT switch 506. The second broadband impedance matching circuit can be designed to have an input impedance that matches the output impedance of the transistor 504, or can be designed to have an output impedance that matches the input impedance of the SPMT switch 506, for example, at the center frequency of the corresponding frequency band. The SPMT switch 506 may also include an internal broadband impedance matching circuit, for example, to match the input impedance of the SPMT switch 508 to 50 Ohms.

As discussed above with regard to FIG. 1, the input impedance of the broadband impedance matching circuit 502 may not accurately match or approximate, with the various frequency sub-bands, the output impedance of the signal source device or system connected to the input impedance of the broadband impedance matching circuit 502. However, the output impedances of the output narrow-band impedance matching circuits 512 can accurately match the input impedances of the corresponding bandpass filters 514. As such, some signal reflection may occur, for example, at the input terminal of the broadband impedance matching circuit 502. Accordingly, the performance of the multi-band RF power amplifier 500, for example, in terms of power added efficiency (PAE), may not be as good as that of the multi-band RF power amplifier 100 of FIG. 1 or the dual band RF power amplifier 200 of FIG. 2.

The multi-band power amplifier circuits discussed with regard to FIGS. 1 through 5 can be implemented (or embedded) in an integrated circuit (IC). For example, the IC can be (or can include) a monolithic microwave integrated circuit (MMIC). When implemented within (or as) an IC, the multi-band power amplifier circuits discussed with regard to FIGS. 1 through 5 allow for significant reduction in the size, weight and cost of the IC, for example, compared to multi-band power amplifier circuits employing a separate power amplifier for each frequency band.

Figure 6:
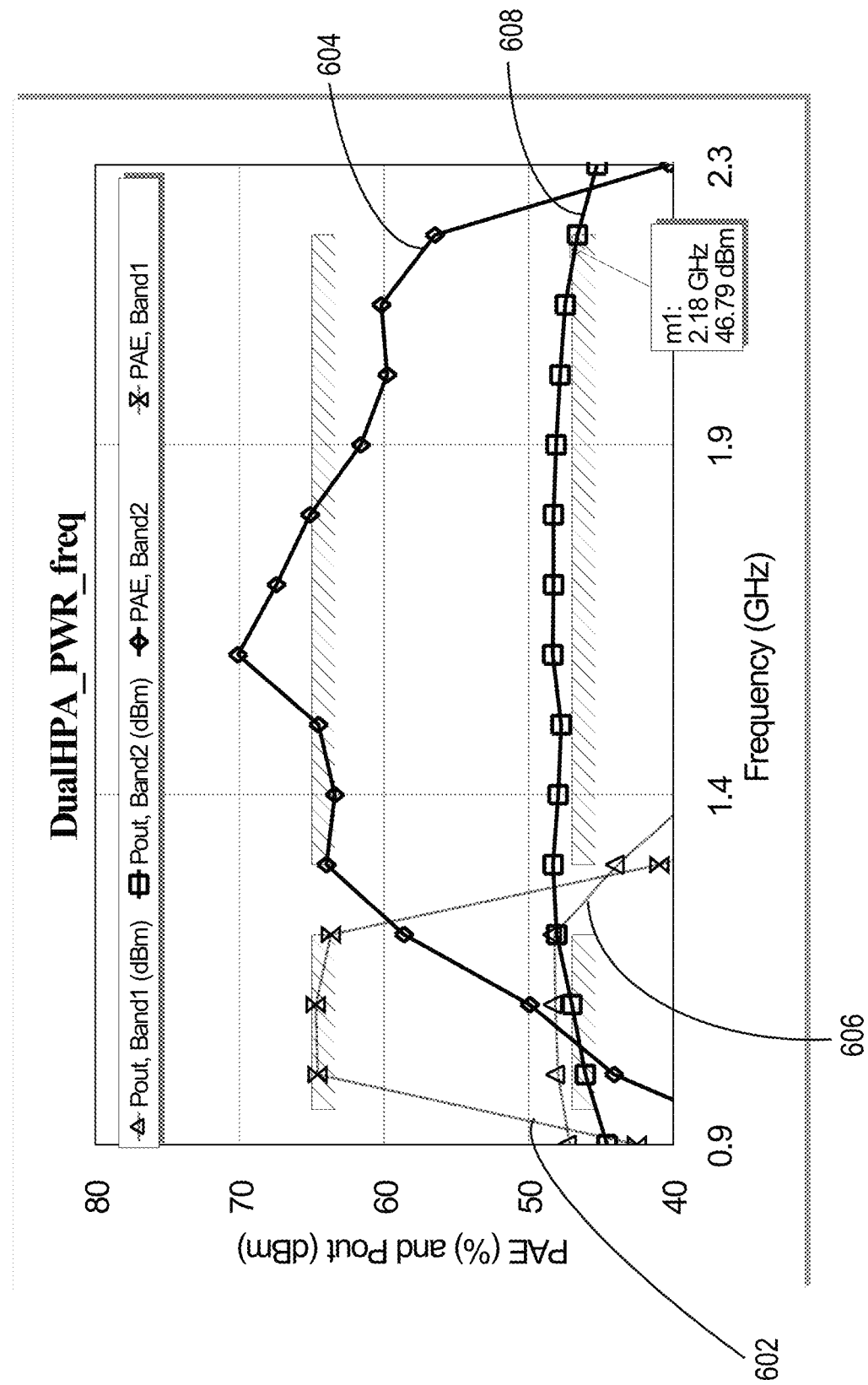
FIG. 6 shows plots illustrating simulation results for the dual band RF power amplifier circuit of FIG. 2, according to inventive concepts of the current disclosure.

FIG. 6 shows plots illustrating simulation results for the dual-band RF power amplifier circuit of FIG. 2, according to inventive concepts of the current disclosure. The two frequency bands are Band 1 with the frequency range 950-1250 MHz, and Band 2 with the frequency range 1350-2200 MHz. Plot 602 represents the power added efficiency (PAE) for Band 1 and plot 604 represents the PAE for Band 2. Plot 608 represent the output power (in dBm) for Band 1 and plot 608 represent the output power (in dBm) for Band 2. The simulation results illustrate that the dual-band RF power amplifier circuit of FIG. 2 can achieve PAEs above 60% and output power about 47 dBm for both frequency bands. The performance of the dual-band RF power amplifier circuit of FIG. 2 is very close to that of a pair of matched impedance amplifiers each of which associated with a corresponding frequency band. However, the dual-band RF power amplifier circuit of FIG. 2 leads to 40% reduction in weight and cost, and more than 40% reduction in size (in terms of unit area) compared to the using a pair of matched impedance amplifiers each of which associated with a corresponding frequency band. For instance, the pair of matched impedance amplifiers can be implemented in an IC with a size of 3 inch by 3 inch. However, the dual-band RF power amplifier circuit of FIG. 2 can be implemented in an IC with size of 2.5 inch by 2 inch.

Figure 7:
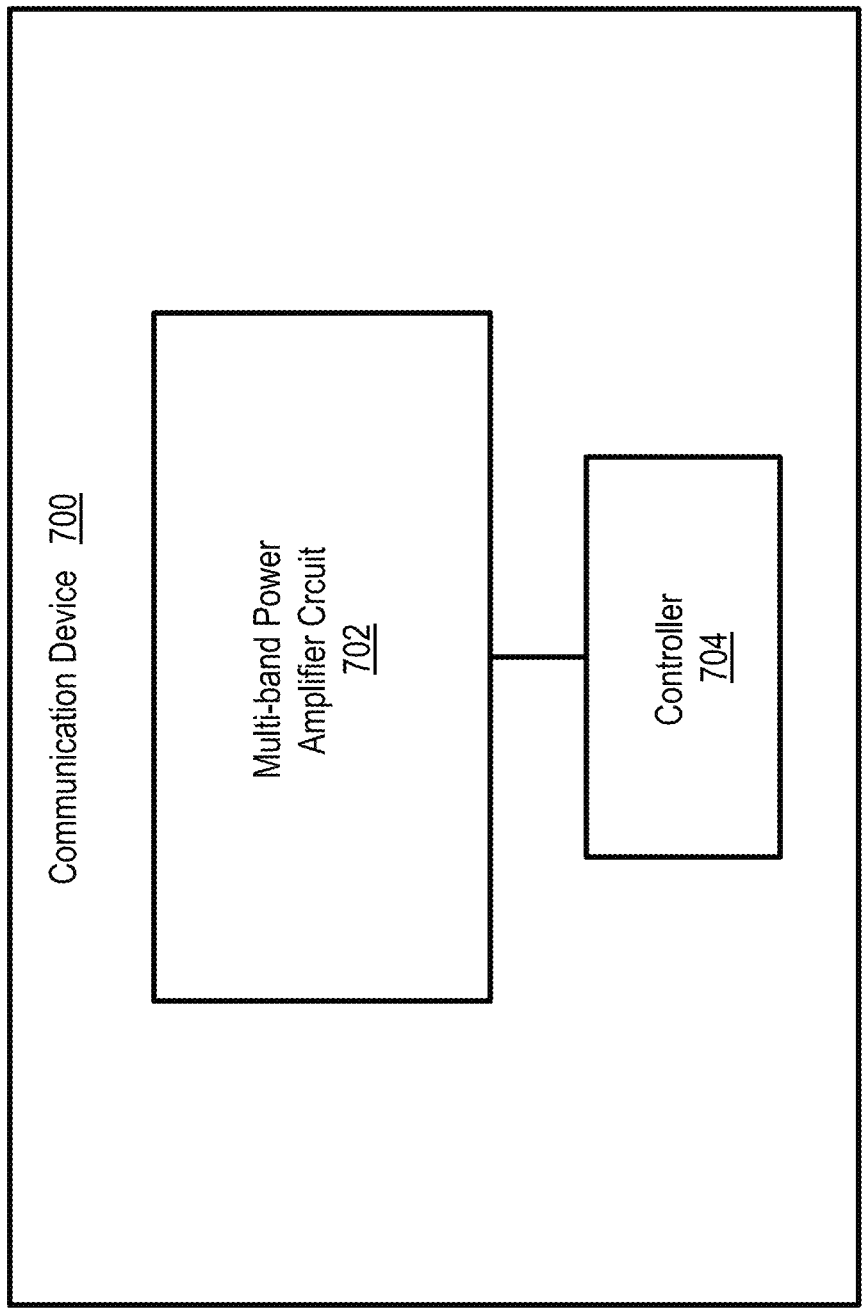
FIG. 7 shows a block diagram illustrating an example communication device integrating a multi-band power amplifier, according to inventive concepts of the current disclosure.

Referring to FIG. 7, a block diagram illustrating an example communication device 700 integrating a multi-band power amplifier is shown, according to inventive concepts of the current disclosure. The communication device 700 can include a multi-band power amplifier circuit 702 and a controller 704 communicatively coupled to the multi-band power amplifier circuit 702. The multi-band power amplifier circuit 702 can be similar to any of the multi-band power amplifier circuits discussed above with regard to FIGS. 1 through 5. For example, the multi-band power amplifier circuit 702 can be similar to the multi-band power amplifier 100 of FIG. 1, the dual band power amplifier circuit 200 of FIG. 2 or the multi-band power amplifier 500 of FIG. 5. The controller 704 can control one or more SPMT switches (e.g., one or more SPDT switches) of the multi-band power amplifier circuit 702. For example, the controller 704 can control DC bias voltages (e.g., as discussed with regard to FIGS. 2-4) of one or more switches of the multi-band power amplifier circuit 702 to cause a switch to switch between several respective poles or several respective throws. As discussed above with regard to FIG. 1, the controller 702 can control the one or more switches based on, for example, the input signals (or corresponding frequency sub-bands) to the multi-band power amplifier circuit 702 and the frequency sub-bands associated with the plurality of throws (or plurality of poles) of each switch.

The communication device 700 can include a multi-band transmitter device, a multi-band receiver device, or a multi-band transceiver device. The communication device 700 can include an antenna system. The communication device 700 can include a mobile device. The communication device 700 can include an avionics multi-band communication device or other multi-band communication device.

Figure 8:
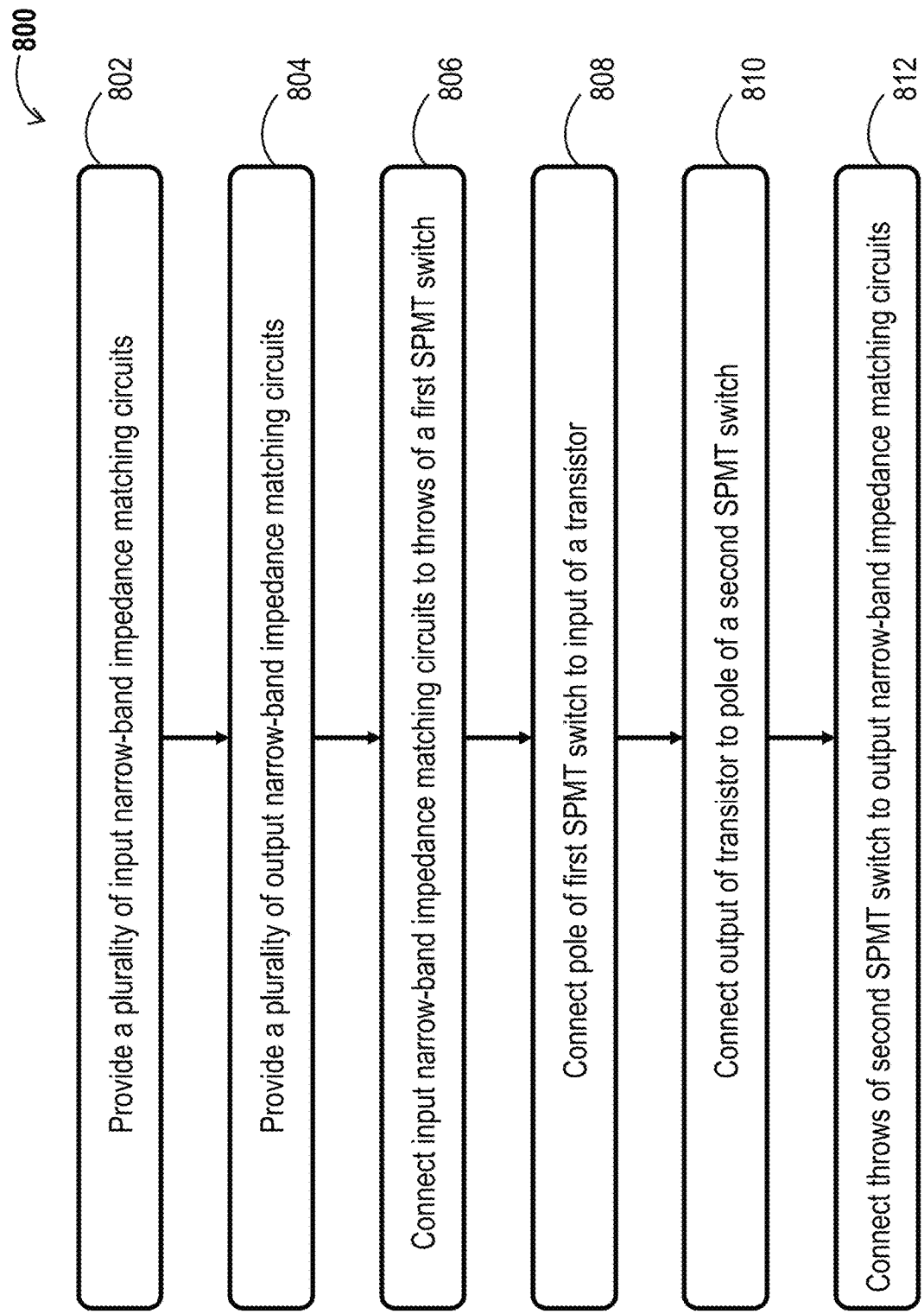
FIG. 8 shows a flow chart illustrating a method of providing a multi-band power amplifier, according to inventive concepts of the current disclosure.

FIG. 8 shows a flow chart illustrating a method 800 of providing a multi-band power amplifier, according to inventive concepts of the current disclosure. The method 800 can include providing a plurality of input narrow-band impedance matching circuits (ACT 802), and providing a plurality of output narrow-band impedance matching circuits (ACT 804). The method 800 can include connecting each input narrow-band impedance matching circuit of the plurality of input impedance matching circuits to a corresponding input terminal (or throw) of a first SPMT switch (ACT 806). The method 800 can include connecting an output terminal (or pole) of the first SPMT switch to an input terminal of a transistor (ACT 808). The method 800 can include connecting an output terminal of the transistor to an input terminal (or pole) of a second SPMT switch (ACT 810). The method 800 can include connecting each output terminal (or throw) of the second SPMT switch to a corresponding output narrow-band impedance matching circuit of the plurality of output impedance matching circuits (ACT 812).

The method 800 can include providing a plurality of input narrow-band impedance matching circuits (ACT 802). Providing the plurality of input narrow-band impedance matching circuits can include designing the plurality of input narrow-band impedance matching circuits such that each input narrow-band impedance matching circuit is associated with (or to be used for signals in) a corresponding frequency sub-band of a plurality of frequency sub-bands supported by the multi-band power amplifier. Providing the plurality of input narrow-band impedance matching circuits can include designing the plurality of input narrow-band impedance matching circuits such that each input narrow-band impedance matching circuit has a respective input impedance that matches (e.g., equal to) a predefined impedance value (e.g., 50 Ohms) within the corresponding frequency sub-band. The respective input impedance of an input narrow-band impedance matching circuit matches the predefined impedance value within the corresponding frequency sub-band if it is equal to the predefined impedance value at one or more frequencies within the corresponding frequency sub-band, or if the difference between the respective input impedance and the predefined impedance value is smaller than a predefined threshold value for frequencies within the corresponding frequency sub-band. Designing each input narrow-band impedance matching circuits can include determining the electric components (e.g., capacitors, inductors, or resistors, among others) of the circuit, the components' parameters (e.g., capacitance values, inductance values, or resistance values, among others), and the connections between the various electric components. For instance, the input narrow-band impedance circuits can be similar (with respect to circuit configuration) to circuits 202*a* and 202*b* of FIG. 2.

The method 800 can include providing a plurality of output narrow-band impedance matching circuits (ACT 804). Providing the plurality of output narrow-band impedance matching circuits can include designing the plurality of output narrow-band impedance matching circuits such that each output narrow-band impedance matching circuit is associated with (or to be used for signals in) a corresponding frequency sub-band of the plurality of frequency sub-bands supported by the multi-band power amplifier. Providing the plurality of output narrow-band impedance matching circuits can include designing the plurality of output narrow-band impedance matching circuits such that each output narrow-band impedance matching circuit has a respective output impedance that matches (e.g., equal to) a predefined impedance value (e.g., 50 Ohms) within the corresponding frequency sub-band. The respective output impedance of an output narrow-band impedance matching circuit matches the predefined impedance value within the corresponding frequency sub-band if it is equal to the predefined impedance value at one or more frequencies within the corresponding frequency sub-band, or if the difference between the respective output impedance and the predefined impedance value is smaller than a predefined threshold value for frequencies within the corresponding frequency sub-band. Designing each output narrow-band impedance matching circuits can include determining the electric components (e.g., capacitors, inductors, or resistors, among others) of the circuit, the components' parameters (e.g., capacitance values, inductance values, or resistance values, among others), and the connections between the various electric components. For instance, the output narrow-band impedance circuits can be similar to (with respect to circuit configuration) circuits 210*a* and 210*b* of FIG. 2.

The method 800 can include connecting each input impedance matching circuit (or corresponding output terminal) of the plurality of input impedance matching circuits to a corresponding input terminal (or a corresponding throw) of the first SPMT switch (ACT 806). The first SPMT switch can have a plurality of input terminals (or throws) and an output terminal (or pole). For the first SPMT, the pole can act as output terminal while the throws can act as input terminals. The first SPMT switch can be similar to the SPMT switches 104 and 108, 400 or 506, or SPDT switches 204, 208, 302, 304 or 306 described above with regard to FIGS. 1 through 5. Connecting each input impedance matching circuit to a corresponding input terminal of the first SPMT switch can include connecting them through an electric wire in an IC.

The method 800 can include connecting the output terminal (or pole) of the first SPMT switch to an input terminal of a transistor (ACT 808), and connecting an output terminal of the transistor to an input terminal (or pole) of a second SPMT switch (ACT 810). The connections can be achieved via electric wiring (e.g., in an IC). The second SPMT switch can have a respective input terminal (or pole) and a plurality of respective output terminals (or throws). For the second SPMT switch, the respective pole can act as input terminal while the respective throws can act as output terminals. The method 800 can include connecting each respective output terminal (or throw) of the plurality of respective output terminals (or throws) of the second SPMT switch to a corresponding output impedance matching circuit of the plurality of output impedance matching circuits ACT 812). The second SPMT switch can be similar to the SPMT switches 104, 108, 400 or 506, or SPDT switches 204, 208, 302, 304 or 306 described above with regard to FIGS. 1 through 5.

The multi-band power amplifier provided by method 800 can be similar to the multi-band power amplifier 100 of FIG. 1 or the dual band power amplifier circuit 200 of FIG. 2. The method 800 can further include providing a controller to control the first and second SPMT switches as discussed above with regard to FIGS. 1 through 7. The method 800 can include connecting the controller to the first and second SPMT switches or respective DC bias terminals.

The construction and arrangement of the systems and methods are described herein as illustrative examples and are not to be construed as limiting. Although only a few embodiments have been described in detail in this disclosure, many modifications are possible (e.g., variations in sizes, dimensions, structures, shapes and proportions of the various elements, values of parameters, mounting arrangements, use of materials, colors, orientations). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method of operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

What is claimed is:

1. A power amplification circuit for use in a multi-band communication system, comprising:
   a first input impedance matching circuit and a second input impedance matching circuit each configured to receive input signals, each input signal associated with at least one of a first frequency band or a second frequency band supported by the power amplification circuit, the first input impedance matching circuit associated with the first frequency band, the second input impedance matching circuit associated with the second frequency band;
   a first single pole double throw (SPDT) switch including a first input terminal, a second input terminal, and a first output terminal, the first input terminal connected to the first input impedance matching circuit, the second input terminal connected to the second input impedance matching circuit, wherein the first SPDT switch is configured to connect the first output terminal to one of the first input terminal or the second input terminal;
   a transistor including a third input terminal and a second output terminal, the third input terminal connected to the first output terminal, the transistor configured to amplify signals received from the first SPDT switch;
   a second single pole double throw (SPDT) switch including a fourth input terminal, a third output terminal, and a fourth output terminal, the fourth input terminal connected to the second output terminal; the second SPDT switch configured to couple the fourth input terminal to one of the third output terminal or the fourth output terminal; and
   a first output impedance matching circuit and a second output impedance matching circuit, the first output impedance matching circuit associated with the first frequency band and connected to the third output terminal, the second output impedance matching circuit associated with the second frequency band and connected to the fourth output terminal;
   wherein the first frequency band is between 950 MHz and 1250 MHz; wherein the second frequency band is between 1350 MHz and 2200 MHz; wherein the power amplification circuit includes a power added efficiency (PAE) above 60 percent across each of the first frequency band and the second frequency band; wherein the power amplification circuit includes an output power above 47 dBm across each of the first frequency band and the second frequency band.

2. The power amplification circuit of claim 1, embedded in an integrated circuit (IC).

3. The power amplification circuit of claim 1, wherein at least one of the first SPDT switch or the second SPDT switch includes series pin-diodes.

4. The power amplification circuit of claim 1, wherein at least one of the first SPDT switch or the second SPDT switch includes shunt pin-diodes.

5. The power amplification circuit of claim 1, wherein at least one of the first SPDT switch or the second SPDT switch includes a switching transistor.

6. The power amplification circuit of claim 1, wherein the transistor includes a bias circuit configured to supply a bias voltage to one or more diodes of at least one of the first SPDT or the second SPDT.

7. The power amplification circuit of claim 1, wherein the first input impedance matching circuit includes a first capacitor, a second capacitor, a third capacitor, a first inductor, a second inductor, and a third inductor; wherein the first capacitor, the first inductor, the second inductor, and the third inductor are provided in series; wherein the second capacitor is coupled between a ground and a first node disposed between the first inductor and the second inductor; wherein the third capacitor is coupled between the ground and a second node disposed between the second inductor and the third inductor.

8. A communication device, comprising:
   a multi-band power amplification circuit including:
      a first input impedance matching circuit and a second input impedance matching circuit each configured to receive input signals, each input signal associated with at least one of a first frequency band or a second frequency supported by the multi-band power amplification circuit, the first input impedance matching circuit associated with the first frequency band, the second input impedance matching circuit associated with the second frequency band;
      a first single pole double throw (SPDT) switch including a first input terminal, a second input terminal, and a first output terminal, the first input terminal connected to the first input impedance matching circuit, the second input terminal connected to the second input impedance matching circuit;
      a transistor including a third input terminal and a second output terminal, the third input terminal connected to the first output terminal, the transistor configured to amplify signals received from the first SPDT switch;
      a second single pole double throw (SPDT) switch including a fourth input terminal, a third output terminal, and a fourth output terminal, the fourth input terminal connected to the second output terminal; and
      impedance matching circuit, the first output impedance matching circuit associated with the first frequency band and connected to the third output terminal, the second output impedance matching circuit associated with the second frequency band and connected to the fourth output terminal; and
   a controller connected to the multi-band power amplification circuit and configured to control the first SPDT switch to connect the first output terminal to one of the first input terminal or the second input terminal and control the second SPDT switch to connect the fourth input terminal to one of the third output terminal or the fourth output terminal based on a frequency band associated with an input signal, the first frequency band, and the second frequency band;

wherein the first frequency band is between 950 MHz and 1250 MHz; wherein the second frequency band is between 1350 MHz and 2200 MHz; wherein the multi-band power amplification circuit includes a power added efficiency (PAE) above 60 percent across each of the first frequency band and the second frequency band; wherein the multi-band power amplification circuit includes an output power above 47 dBm across each of the first frequency band and the second frequency band.

9. The communication device of claim 8, wherein at least one of the first SPDT switch or the second SPDT switch includes series pin-diodes.

10. The communication device of claim 8, wherein at least one of the first SPDT switch or the second SPDT switch includes shunt pin-diodes.

11. The communication device of claim 8, wherein at least one of the first SPDT switch or the second SPDT switch includes a switching transistor.

12. The communication device of claim 8, wherein the transistor includes a bias circuit configured to supply a bias voltage to one or more diodes of at least one of the first SPDT or the second SPDT.

13. The communication device of claim 8, wherein the first input impedance matching circuit includes a first capacitor, a second capacitor, a third capacitor, a first inductor, a second inductor, and a third inductor; wherein the first capacitor, the first inductor, the second inductor, and the third inductor are provided in series; wherein the second capacitor is coupled between a ground and a first node disposed between the first inductor and the second inductor; wherein the third capacitor is coupled between the ground and a second node disposed between the second inductor and the third inductor.

* * * * *